United States Patent [19]

Saho et al.

[11] Patent Number: 5,084,676
[45] Date of Patent: Jan. 28, 1992

[54] NUCLEAR MAGNETIC RESONANCE APPARATUS

[75] Inventors: Norihide Saho, Tsuchiura; Shinji Yamamoto, Katuta; Tuyosi Shudo; Masayuki Otsuka, both of Katsuta; Tohsuke Hirata, Ibaraki; Katsuaki Kikuchi, Tsuchiura; Shinichi Shimode; Takeo Nemoto, both of Ibaraki, all of Japan

[73] Assignee: Hitachi, Ltd., Tokyo, Japan

[21] Appl. No.: 454,262

[22] Filed: Dec. 21, 1989

[30] Foreign Application Priority Data

Dec. 23, 1988 [JP] Japan .................................. 63-323353
Jun. 30, 1989 [JP] Japan .................................. 1-166692

[51] Int. Cl.$^5$ .............................................. G01R 33/20
[52] U.S. Cl. ...................................... 324/318; 324/322
[58] Field of Search ............... 324/300, 307, 309, 318, 324/319, 322; 128/653 A; 335/219, 216, 299, 300; 336/199, 208, 225

[56] References Cited

U.S. PATENT DOCUMENTS

| 4,636,729 | 1/1987 | Maurer | 324/318 |
| 4,639,672 | 1/1987 | Beaumont | 324/318 |
| 4,954,781 | 9/1990 | Hirata | 324/300 |

Primary Examiner—Michael J. Tokar
Attorney, Agent, or Firm—Antonelli, Terry, Stout & Kraus

[57] ABSTRACT

A nuclear magnetic resonance apparatus in accordance with the present invention includes ferro-magnetic field generation means and gradient field generation means and fixes the gradient field generation means at a predetermined position inside a cylindrical space by a support member. An elastic member is interposed between the support member and the gradient field generation means, and means for improving rigidity of the gradient field generation means, such as another support member and a fastening jig of the gradient field generation means, is disposed and fixed to the elastic member described above. In the manner image quality can be improved and noise can be reduced.

20 Claims, 6 Drawing Sheets

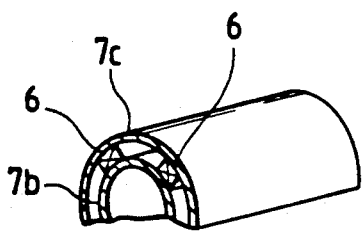
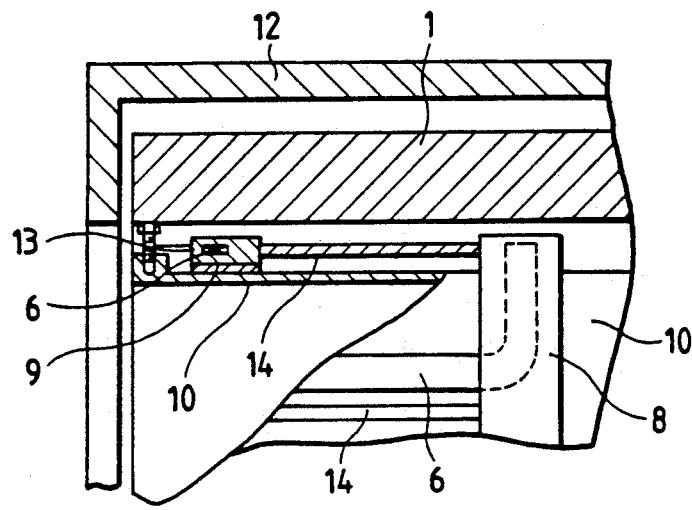
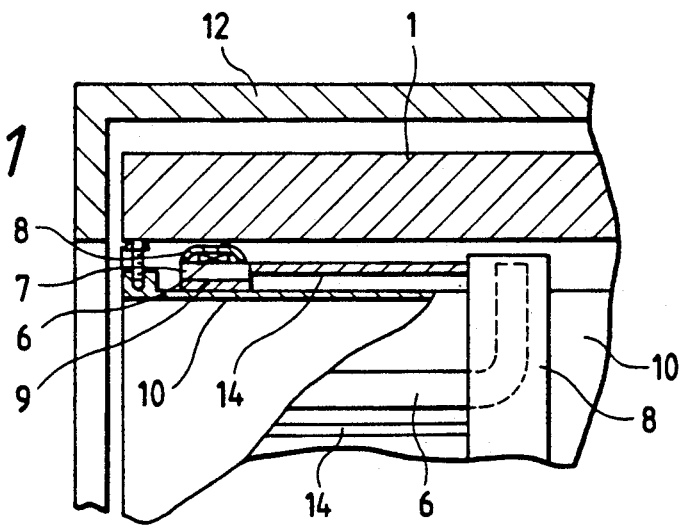
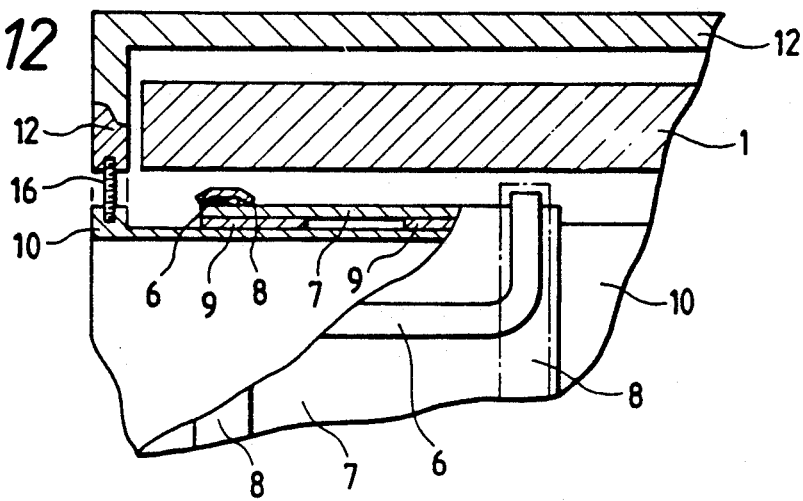

NUCLEAR MAGNETIC RESONANCE APPARATUS

BACKGROUND OF THE INVENTION

1. Field of the Invention

This invention relates to a deformation prevention structure of gradient magnetic field coils in a nuclear magnetic resonance (NMR) apparatus.

2. Description of the Prior Art

In a conventional NMR apparatus for medical use, a pair of saddle-like gradient field coils disposed in such a manner as to cross orthogonally a static field in a bore formed inside a cryostat and face each other in X - Y directions of the section are directly fixed onto a cylindrical support member or bobbin made of an epoxy resin or the like having extremely great resistivity, as disclosed in Japanese Patent Laid-Open No. 279238/1986. A periodical pulse current is caused to flow through the gradient field coils to generate a periodical gradient field inside the bore in order to obtain a three-dimensional sectional image signal of a subject. When this pulse current is caused to flow, electromagnetic force acts on a lead wire through which the current flows in a direction crossing transversely the static field inside the bore in accordance with the Fleming's lefthand rule and a force that causes deformation of the gradient field coils acts. Accordingly, a pulse-like load is applied to the bobbin. Since this load causes oscillation of the bobbin and generates noise, a vibration-proofing rubber is sandwiched between the bobbin and the gradient field coils and the gradient field coils are further bound onto the vibration-proofing rubber by a band.

In a conventional NMR apparatus for medical use, on the other hand, a pair of saddle-like gradient field coils are directly fixed onto a bobbin as a first cylindrical support member made of a material having extremely great resistivity such as an epoxy resin, as disclosed in Japanese Patent Laid-Open Nos. 261105/1987 and 229906/1987. The gradient field coils are disposed in a uniform static field inside the bore and a periodical pulse current is caused to flow through the gradient field coils in order to conduct two-dimensional sectional image processing of a subject inside the bore and to provide a periodical gradient field distribution inside the static field. Accordingly, when the pulse current is passed, electromagnetic force in a radial direction occurs at a peripheral portion of the gradient field coils due to the static field.

Mention can be made of Japanese Patent Laid-Open Nos. 158047/1988 and 239503/1987 as other prior art techniques for supporting the gradient field coils.

In the NMR apparatus described above, the gradient field coils undergo deformation by a quantity corresponding to contraction due to the load of the vibration-proofing rubber sandwiched between them, the gradient field coils themselves oscillate due to insufficiency of rigidity in directions other than a tensile direction, changes occur in the magnetic field distribution inside the bore which is generated precisely by the gradient field coils and distortion of an image different from an actual image occurs in the final image.

Since the gradient field coils are directly fixed onto the bobbin in the NMR apparatus described above, the bobbin causes oscillation due to the pulse-like load resulting from the electromagnetic force and generates great noise when the pulse current is passed, thereby imparting offensive feel to the subject. The noise generated in this case ranges from a low frequency of 250 Hz to a high frequency fo 8 KHz.

SUMMARY OF THE INVENTION

The present invention is intended to solve the problems described above and is directed to provide a nuclear magnetic resonance (NMR) apparatus capable of forming a high quality image and reducing noise generated by electromagnetic force of gradient field coils.

The NMR apparatus in accordance with the present invention comprises ferro-magnetic field generation means for supplying a uniform and high magnetic field to a cylindrical space, gradient field generation means for providing a gradient field distribution in a radial direction inside the cylindrical space and a support member for fixing the gradient field generation means to predetermined positions inside the cylindrical space, and is characterized in that an elastic member having lower rigidity than the support member is disposed between the gradient field generation means and the support member in such a manner as to be fixed by the support member, and means for improving overall rigidity of the gradient field generation means is fixed to the elastic member.

Definite examples of the means for improving rigidity are (1) a separate support member sandwiched between the gradient field generation means and the elastic member (see FIG. 1) and (2) a fastening jig for fixing the gradient field generation means to the elastic member (see FIG. 17).

The support member (1) is directed to precisely position the gradient field coils inside the bore by fixing the gradient field coils to a second bobbin for fixing and integrating this second bobbin to a first bobbin for positioning and supporting through the elastic member.

The NMR apparatus of the present invention comprises ferro-magnetic field generation means for supplying a uniform and high magnetic field to a cylindrical space, gradient field generation means for supplying a gradient field distribution in a radial direction inside the cylindrical space and a first support member for fixing the gradient field generation means at predetermined positions inside the cylindrical space, and is characterized in that an elastic member having lower rigidity than the first support member is disposed between the gradient field generation means and the first support member and a second support member having higher rigidity than the elastic member is provided to the gradient field generation means.

The NMR apparatus of the present invention comprises ferro-magnetic field generation means for supplying a uniform and high magnetic field to a cylindrical space, gradient field generation means for providing a gradient field distribution in a radial direction inside the cylindrical space and a first support member for supporting thereoutside the gradient field generation means by fixing it to a cryostat equipped with the ferro-magnetic field generation means, and is characterized in that a second support member having high rigidity, for mounting the gradient field generation means, and an elastic support member for supporting the second support member outside the first support member are disposed between the first support member and the gradient field generation means and rigidity of the elastic member is lower than rigidity of the first and second support members.

In this case, a third support member may be used at fixing positions of the first support member in place of the cryostat described above.

In any case, each support member is preferably toroidal or cylindrical. It is convenient for supporting and fixing in this case to make the length of the second support member in the axial direction of the cylindrical space shorter than that of the first support member.

Other preferred embodiments of the NMR apparatus of the present invention include the arrangements wherein at least part of the gradient field generation means is buried in the second support member, wherein a plurality of vent holes are formed on the side surfaces of the first and second support members, wherein sound-absorbing materials are provided to at least one of the ferro-magnetic field generation means, the cryostat storing the ferro-magnetic field generation means and the first support member, wherein the vent holes of the second support member are positioned so as to face the vent holes of the first support member and wherein vent holes which are continuous in the axial direction are disposed in the section of the thickness of the sheet of the first and second support members.

A subject-storing container of the NMR apparatus in accordance with the present invention is characterized in that gradient field generation coils are provided to the outside of a cylindrical support member having high rigidity, at least part of the coils is protected by a fiber-reinforced resin, a toroidal support member corresponding to an inner cylinder is inserted through this cylindrical support member serving as an outer cylinder, and both support members are connected by an elastic member having rigidity lower than that of each support member. It is preferred in this case that at least part of the gradient field generation coils is disposed sequentially through elastic fiber-reinforced resin layers outside the cylindrical support member having high rigidity.

The subject-storing container is preferably produced by putting through the elastic member an outer cylinder having formed thereon vent holes onto an inner cylinder having formed thereon likewise vent holes and forming a fitting portion to the main body of the NMR apparatus on the inner cylinder. In other words, the most preferred embodiment of the subject-storing container of the present invention is a double-support structure wherein first and second cylindrical (toroidal) support members having mutually different diameters are supported by the elastic member in such a manner as not to close their vent holes.

In the NMR apparatus in the foregoing item (2) of the present invention, the gradient field coils in the X, Y and Z directions are integrally fastened or molded. In this case, it is practical to employ the arrangement wherein the gradient field coils are integrated with a bobbin for positioning and supporting through an elastic member and are positioned precisely inside the bore, a plurality of mass-spring systems are provided to the outer peripheral surface of the bobbin so as to generate oscillation having a phase opposite to that of oscillation of the outer peripheral surface of the bobbin and thus to offset oscillation of the bobbin, and sound-absorbing materials such as urethane, glass wool, etc, are bonded to the inner and outer peripheral surfaces of the bobbin so as to reduce noise having a frequency that cannot be reduced by the mass-spring systems.

In the present invention, the pulse-like load of the gradient field coil generated by the electromagnetic force (that is, major proportion of distortion energy generated by the electromagnetic force of the gradient field coil) is borne by the second support member (bobbin) having high rigidity in order to prevent deformation of the gradient field coil and to prevent propagation of oscillation to the first bobbin for supporting by the elastic member.

Since deformation of the gradient field coil when the pulse current is passed through the gradient field coil can be prevented in this manner, a high quality image can be obtained. In addition, since oscillation of the second support member does not propagate to the first support member and to the cryostat, noise can be reduced and any offensive feel is not imparted to the subject.

The pulse-like load of the gradient field coil generated by the electromagnetic force is absorbed by the elastic member sandwiched between the gradient coil and the bobbin in the present invention.

The fixing member having high rigidity, for fastening the gradient field coils in the three direction, i.e., X, Y and Z directions, increases rigidty of the gradient field coils and exhibits the function of making uniform the rigidity in all directions when the gradient field coils are supported by the elastic member.

If the intrinsic frequency of the mass-spring system is brought into conformity with the frequency of the bobbin, the mass-spring system oscillates in the opposite direction to the oscillating direction of the bobbin and functions to suppress the bobbin oscillation. Accordingly, noise resulting from the oscillation of the bobbin can be reduced.

The sound-absorbing material bonded to the inner and outer peripheral surfaces of the bobbin absorbes the noise of the frequency that cannot be reduced by the mass-spring system by the sound-absorption effect and can reduce the noise.

In accordance with the present invention, the deformation load acting on the gradient field coils due to the electromagnetic force occurring when the pulse current is passed through the gradient field coils is borne by the second support member having high rigidity or by the elastic member such as the coil, its deformation quantity is reduced to a sufficiently low level and its load is dispersed on the inner surface of the second support member or its major proportion is absorbed by the elastic member and can be propagated uniformly to the first support member or the bobbin that is positioned through the elastic member. Accordingly, the deformation quantity of the first support member (bobbin) and the second support member can be reduced sufficiently. For this reason, disturbance of the magnetic field due to motion of the gradient field coils is eliminated and a high quality image can be obtained.

Since oscillation of the second support member (coil) resulting from the electromagnetic force is absorbed by the flexible member and its oscillation is not transmitted to the first support member (bobbin) and to the cryostat and since the radiation area of the second support member can be reduced, noise can be reduced and any offensive feel is not applied to the subject.

Since oscillation having the opposite phase to the phase of oscillation of the bobbin outer peripheral surface can be applied by the mass-spring systems, oscillation of the bobbin outer peripheral surface can be cancelled and noise resulting from oscillation of the bobbin can be reduced.

Furthermore, noise having the frequency which cannot be reduced by the mass-spring systems can be reduced by the sound-absorbing material bonded to the inner and outer peripheral surfaces of the bobbin.

BRIEF DESCRIPTION OF THE DRAWINGS

FIGS. 8 and 9 are perspective views of principal portions showing the structure of a support which is applied to another embodiment of the invention shown in FIG. 1;

FIGS. 10 to 14 show other embodiments of the present invention and are partial sectional views of principal portions when part of an inner structure is viewed from its side;

DESCRIPTION OF THE PREFERRED EMBODIMENTS

Hereinafter, preferred embodiments of the present invention will be explained with reference to the drawings.

Figure 1:
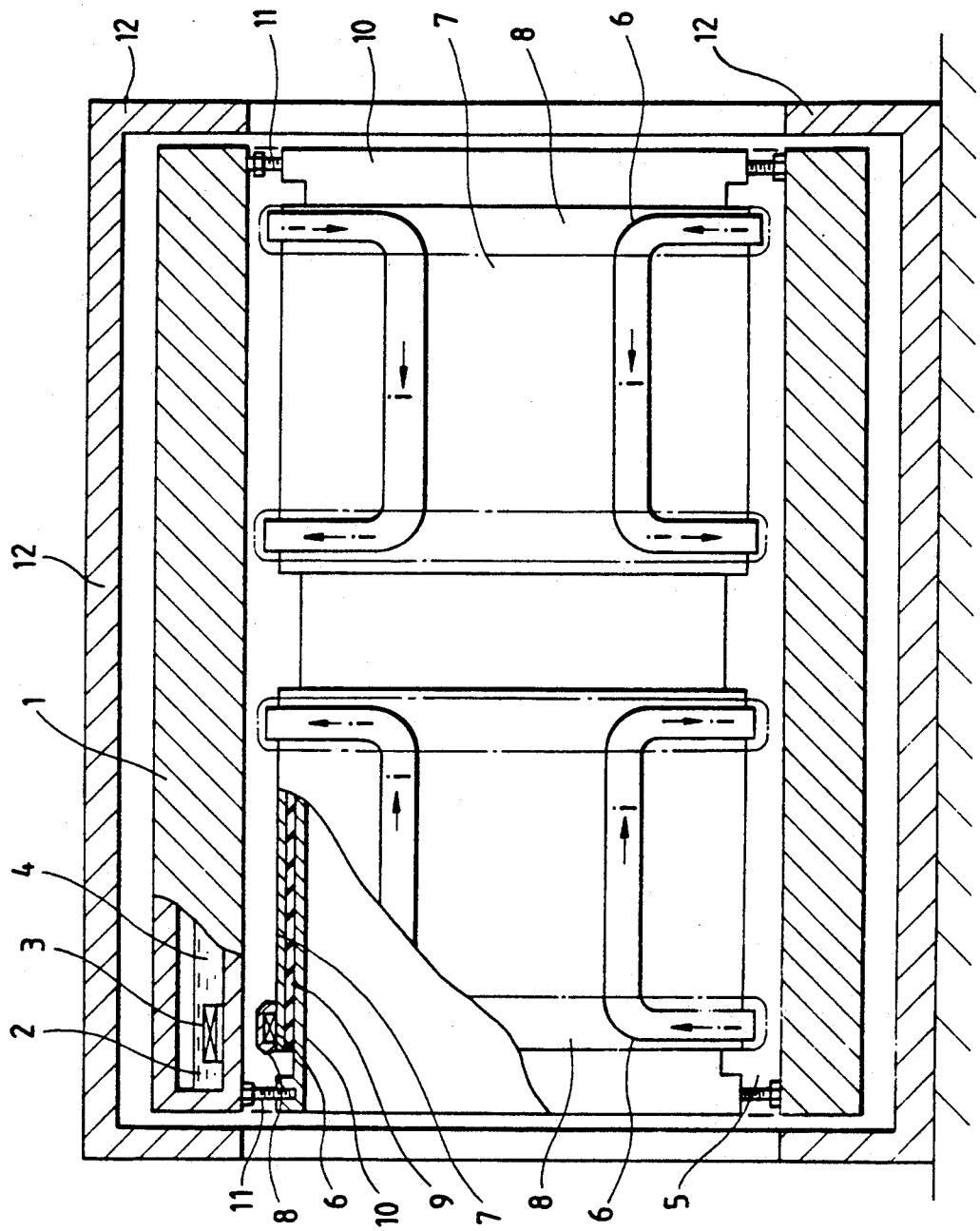
FIGS. 1 and 16 are partial sectional views of an inner structure of an NMR apparatus in accordance with an embodiment of the present invention.

FIG. 1 shows the structure of the NMR apparatus in accordance with an embodiment of the present invention and is an explanatory view useful for explaining the interior of the apparatus by removing an outer cylinder (shield portion) in front from the side surface of a cylindrical member and a cryostat portion.

A liquid helium tank 2 is disposed inside a cryostat 1 whose interior is vacuum heat-insulated and a super-conductor magnet 3 for generating a static field is stored in the helium tank 2 to constitute ferro-magnetic field generation means. The super-conductor magnet 3 is cooled by liquid helium 4. This super-conductor magnet 3 generates a static field of 0.5 to 4 Teslas in an axial direction inside a bore 5 of a central space of the cryostat 1.

Figure 2:
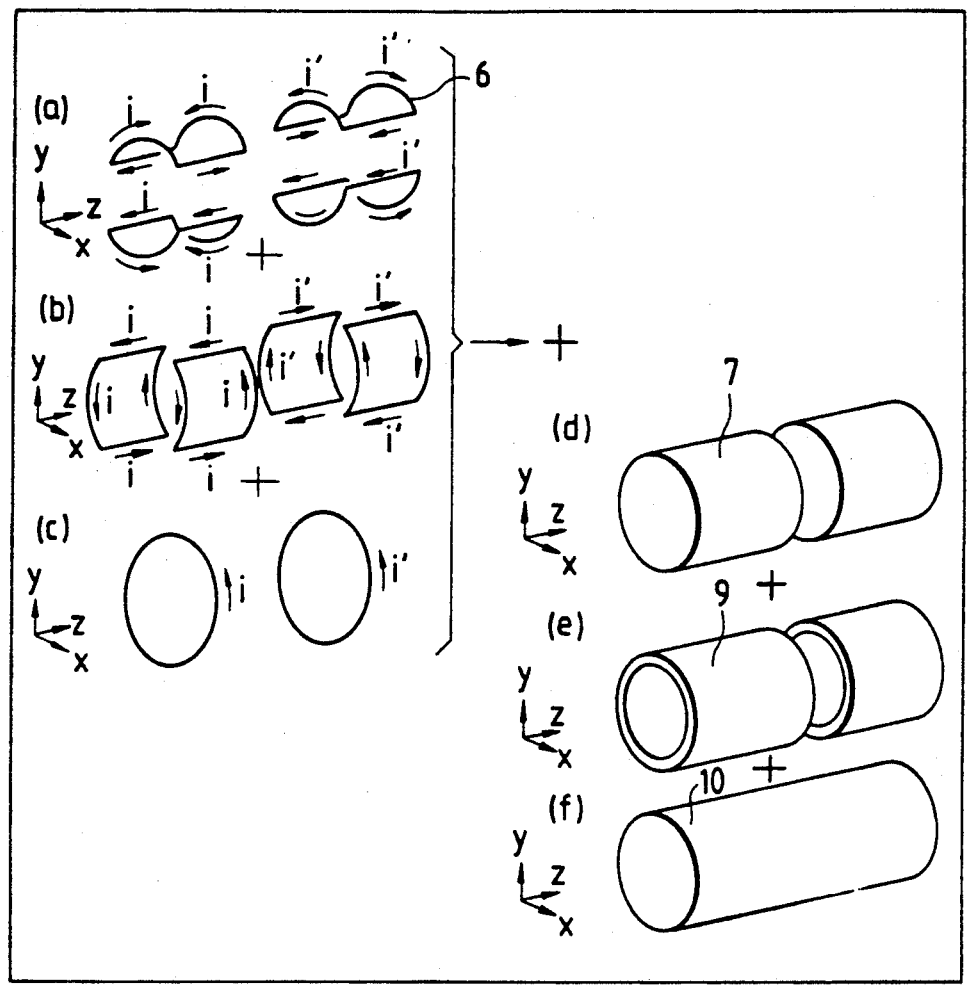
FIG. 2 is a perspective view of an assembly of a subject-storing container which is applied to the apparatus of the embodiment shown in FIG. 1.

Gradient field coils 6 are disposed inside the bore 5 in y direction (a), x direction (b) and z direction (c) with respect to the direction Z of the static field as shown in FIG. 2. These gradient field coils 6 are wound onto the outside of a bobbin (d) as a second support member 7, are then fixed by a tape-like material such as a resin-impregnated cloth or the like and are supported by a bobbin (f) as a first support member 10 one of the ends of which is fixed to the cryostat 1. Pulse currents i, i' to be passed through the coils are such as (a), (b) and (c) shown in the drawing. The coils which receive the electromagnetic force are saddle-like coils of (a) and (b) and a load acts on the portion of each coil where the current flows in a peripheral direction. FIG. 1 shows only the gradient field coil 6 in the y direction of (a).

The coil (b) is omitted from FIG. 1 because the drawing gets too much complicated and understanding becomes difficult and the coil (c) is omitted because the influence of the load is not much great.

Two pairs of gradient field coils 6 are disposed in the y direction in order to generate a field distribution inside the bore 5 or from above to below to the sheet of drawing in this embodiment. The gradient field coils 6 are placed on a second support member 7 for fixing which is made of ceramics having high rigidity such as thick fiber-incorporating epoxy resin, and an electro-magnetic force acting portion is fixed firmly from above to the second support member 7 by a tape-like fixing member 8 having tensile strength. Incidentally, the fixing member 8 used in this embodiment has a reduced thickness so as to emit easily Joule heat of the coils to the atmosphere.

The first and second support members 10 and 7 are made of the same material in this embodiment, which is an elastic member having high rigidity such as a fiber (or cloth)-reinforced resin material.

An elastic member 9 such as a rubber mat is interposed uniformly between the first and second support members 10 and 7 so as to bear uniformly the load acting on the coils by the first support member 10 with a wide area through the rubber mat 9 inside the second support member 7. The contact surfaces of these three members are bonded to one another by an adhesive or the like. Bonding may be made by applying directly the adhesive to their boundary surfaces or may be tightly fitted by utilizing elastic deformation of the elastic member.

Both end portions of the first support member 10 are supported by support bolts 11 on the inner surface of the cryostat 1 so as to make positioning of the saddle-like coils 6 (that is, core alignment of the cylindrical member). A magnetic shield member 12 made of iron and having a weight of several tons is disposed outside the cryostat so as to reduce a leakage flux space zone.

When a pulse current for generating the gradient field is caused to flow through each saddle-like gradient field coil 6, the electromagnetic force acting on the peripheral portion of the coil acts outwards in a radial direction on the left end upper coil peripheral portion and acts towards the center of axis on the lower coil peripheral portion when the direction of the static field lies in the rightward direction from the left in FIG. 1 in accordance with the Fleming's lefthand rule. Since the current flows in the reverse direction through the peripheral portion at the left center portion of the coil 6, the load in the opposite direction acts on it. The action described above which results from the electromagnetic force is to cause deformation of the saddle-like coils 6 and if the coils 6 undergo deformation, distortion occurs in the gradient field and image processing accuracy drops.

However, since the gradient field coils 6 are fixed firmly onto the second support member 7 having high rigidity in this embodiment, deformation of the gradient field coils 6 due to this load is restricted and its displacement quantity can be made extremely small. In other words, almost all of distortion of the gradient field coils 6 is absorbed by the second support member 7. Though the remaining energy is transmitted as oscillation to the first support member 10, its major proportion is absorbed by the elastic member 9.

The load of the gradient field coils 6 acting on the second support member 7 is dispersed to a wide area of the inner surface of the second support member 7 and transmitted to the rubber mat 9 but the load per unit area is small and the load is borne throughout the entire range of the bonded rubber mat 9. Accordingly, the deformation quantity of the rubber mat 9 can be reduced sufficiently and at the same time, oscillation of the first support member 10 can be restricted, too. Accordingly, the displacement quantity of the gradient field coils 6 inside the bore 5 is sufficiently small and does not cause disturbance of the gradient field distribution so that a high quantity image can be obtained in the three-dimensional space.

On the other hand, oscillation due to the electromagnetic force of the second support member 7 to which the gradient field coils 6 are fixed is absorbed by the rubber mat 9 which absorbs well the oscillation of this zone because its rigidity is increased and high frequency components become great, and oscillation is not easily propagated to the first support member 10. Therefore, the oscillation sound of the first support member 10 having a large radiation area and that of the cryostat 1 can be prevented and the noise can be reduced drastically.

In this embodiment, the bobbin axial length of the second support member 7 may be shorter than that of the conventional bobbin. Accordingly, the frequency generated becomes high and even the rubber-like elastic member 9 which cannot easily absorb oscillation in a low frequency zone can sufficiently absorb its oscillation energy. In this case, the same effect can be obtained by winding the elastic member 9 onto the first support member 10, then winding a liquid epoxy resin and fibers, solidifying them, placing the saddle-like coils 6, winding further the liquid epoxy resin and the fibers and solidifying and integrating them together.

Figure 3:
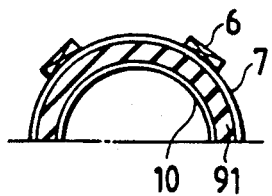
FIGS. 3 to 7 are schematic sectional views of principal portions showing examples of arrangements of support members and elastic members applied to the embodiment shown in FIG. 1.
Figure 4:
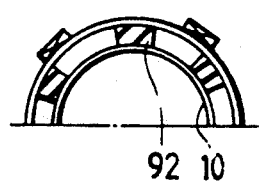
Figure 5:
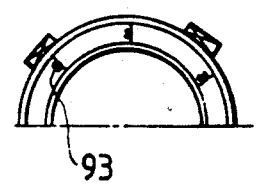
Figure 6:
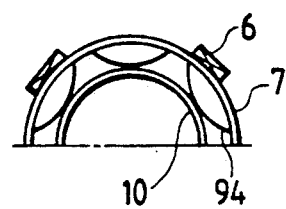
Figure 7:
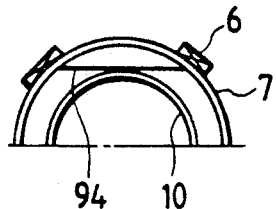

On the other hand, the elastic member 9 changes a spring constant in the direction of sheet thickness to the direction of sheet thickness. For example, a rubber mat 91 formed by alternately laminating rubber sheets having mutually different spring constants is uniformly interposed (see FIG. 3) or an even-numbered or odd-numbered block-like blocks 92 (see FIG. 4), coil springs 93 (see FIG. 5) and leaf springs 94 (see FIGS. 6 and 7) are uniformly disposed to obtain the same effect.

This embodiment uses an indirect support structure through the elastic member in order to reduce rigidity of the first support member 10 and according to this structure, absorption of oscillating of the fixing members (the second support member 7 and the coils 6) and prevention of resonance of the first support member can be accomplished. Particularly when the elastic member is a rubber, absorption in the high frequency range is great and if it is a coil-like spring, absorption in the low frequency range can be also attained, and there can be obtained the side-effect that displacement in the axial direction can be restricted if it is a leaf spring.

Since the length of the second support member 7 in the axial direction is made smaller than that of the first support member 10 in this embodiment, the frequency can be generated in a high frequency range.

Though part of each coil 6 is fixed by a tape-like material, this fixing portion need not extend throughout the entire range of the coil 6 but sufficient effects can be obtained if part of the coil is fixed only at the portion where the load acts.

In accordance with this embodiment, oscillation resulting from the electromagnetic force of the gradient field coils is absorbed by a plurality of bobbins and the elastic members interposed between the bobbins. Therefore, the sound that occurs when the pulse current is passed can be reduced. Incidentally, the elastic member 9 need not exist throughout the entire periphery and the same effect can be obtained by disposing an even-numbered or odd-numbered block-like elastic members at the load points of the saddle-like coils.

Figure 8:
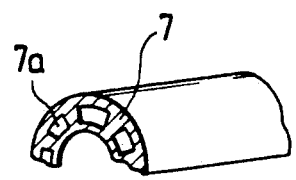

FIG. 8 shows another embodiment of the present invention. The difference of this embodiment from the embodiment shown in FIG. 1 lies in that hollow portions 7a are formed in the sectional structure of each of the first and second support members (bobbins) and the second moment of area of the bobbin is increased by the material having the same weight. According to this embodiment, rigidity can be further increased so that deformation of the gradient field coils can be prevented and the weight can be reduced. Furthermore, heat radiation from the bobbin can be improved and thermal strain of the gradient field coils can be reduced. Moreover, a high quality image can be obtained.

FIG. 9 shows still another embodiment of the present invention. The difference of this embodiment from the embodiment shown in FIG. 1 resides in that the second support member 7 is divided into inner and outer two segments, the gradient field coils 6 are sandwiched and fixed by 7b and 7c and the respective contact portions are fixed by an adhesive or the like. According to this embodiment the gradient field coils 6 can be fixed more strongly and since heat radiation of the coils can be made directly from the coil side, the thermal strain can be further reduced and a high quality image can be obtained.

FIG. 10 shows still another embodiment of the present invention. The difference of this embodiment from the embodiment shown in FIG. 1 resides in that the second support member is further shortened to bobbins 13 and right and left bobbins 13 are supported by rods 14 at several positions. Incidentally, the peripheral portion of each saddle-like coil 6 is buried into the bobbin 13.

According to this embodiment, since the sheet thickness of the bobbin (that is, the sheet thickness of the second support member) can be increased using the same quantity of the blank weight, rigidity increases and deformation of the gradient field coil 6 due to the electromagnetic force can be further reduced so that a higher quality image can be obtained.

According to this embodiment, further, the frequency of oscillation occurring in the second support member becomes higher and the oscillation absorption effect of the rubber sheet can be further improved and the sound can be further reduced. In other words, since the radiation area of the bobbin 13 can be reduced, the reduction effect of the noise due to oscillation of the second support member is great.

Incidentally, the same effect can be obtained in this embodiment by dividing the second support member (bobbin 13) into two parts and clamping and fixing the saddle-like coils from above and below. The similar effect can also be obtained by winding the elastic member 9 to the portion of the first support member 10 corresponding to the bobbin 13, winding and solidifying the liquid epoxy resin and the fiber, placing then the saddle-like coils 6 and further winding and solidifying for integration of the liquid epoxy resin and the fiber.

FIG. 11 shows an alternative embodiment to FIG. 10. In this embodiment, the elastic member 9 is wound at part (the coil disposition portion) of the outer peripheral surface of the first support member 10, the second support member 7 is placed on this flexible member 9 and after the gradient field coil 6 is mounted onto this second support member 7, at least part (the portion affected by the load) of this coil 6 is covered by the fiber (or cloth)-reinforced (impregnated) resin layer and fixed by it. This embodiment provides the same effect as the embodiment shown in FIG. 10 but further simplifies the production of the apparatus.

FIG. 12 shows still another embodiment of the present invention. The difference of this embodiment from the embodiment shown in FIG. 1 resides in that the axial length of the first support member 10 is somewhat increased and the first support member 10 is fixed to the magnetic shield member 12 by a support 16. In this embodiment, since rigidity of the magnetic shield plate 12 is by far greater than that of the inner wall surface of the cryostat 1, deformation of the first support member 10 at the support member 16 portion is extremely small even when the electromagnetic force acts on the gradient field coil 6, the displacement quantity of the gradient field coil supported indirectly by the first support member 10 can be reduced and a high quality image can be obtained. Moreover, since oscillation of the second support member 7 is absorbed by the thick magnetic shield member 12, it is not at all transmitted to the cryostat 1 having a thin shell so that the resonance sound of the cryostat can be eliminated and the noise can be reduced. In this case, resonance of the cryostat tank can be prevented, too, by supporting the first support member by dedicated fixing jigs which are supported from the floor on which the NMR apparatus is disposed.

Figure 13:
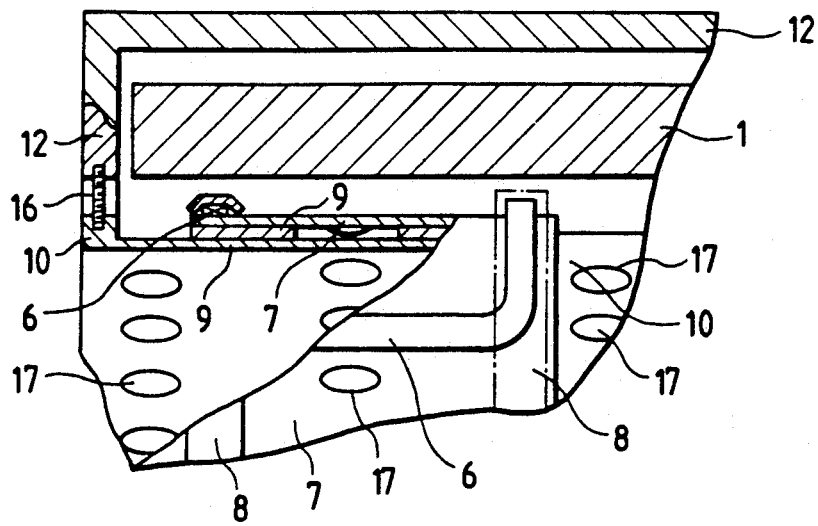

FIG. 13 shows still another embodiment of the present invention. The difference of this embodiment from the embodiment shown in FIG. 12 resides in that vent holes 17 are opened on the second and first support members 7, 10 so as to attain air flow between the inner and outer spaces of the support members constituting the inner and outer cylinders and to improve heat radiation characteristics of the gradient field coils 6. According to this embodiment, therefore, thermal strain of the coil 6 becomes small, deformation of the coil 6 is restricted and the image quality can be further improved. In addition, fluctuation of the air pressure due to oscillation can be mitigated and the sound can be reduced by further reducing the acoustic pressure level.

Figure 14:
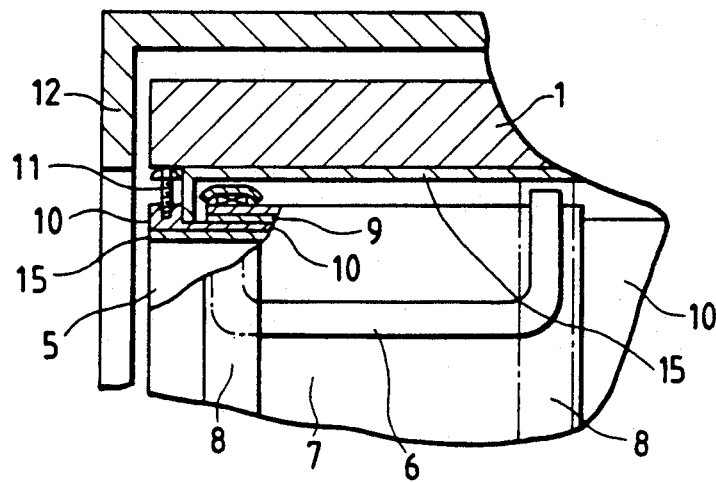

FIG. 14 shows still another embodiment of the present invention. The difference of this embodiment from the embodiment shown in FIG. 1 resides in that the sound-absorbing material 15 is bonded to the inner surface of the cryostat 1 and first support member 10. According to this embodiment, since the reflected sound (after air propagation) of the sound occurring in the second support member 7 is absorbed, the acoustic pressure level inside the bore 5 can be further reduced.

Figure 15:
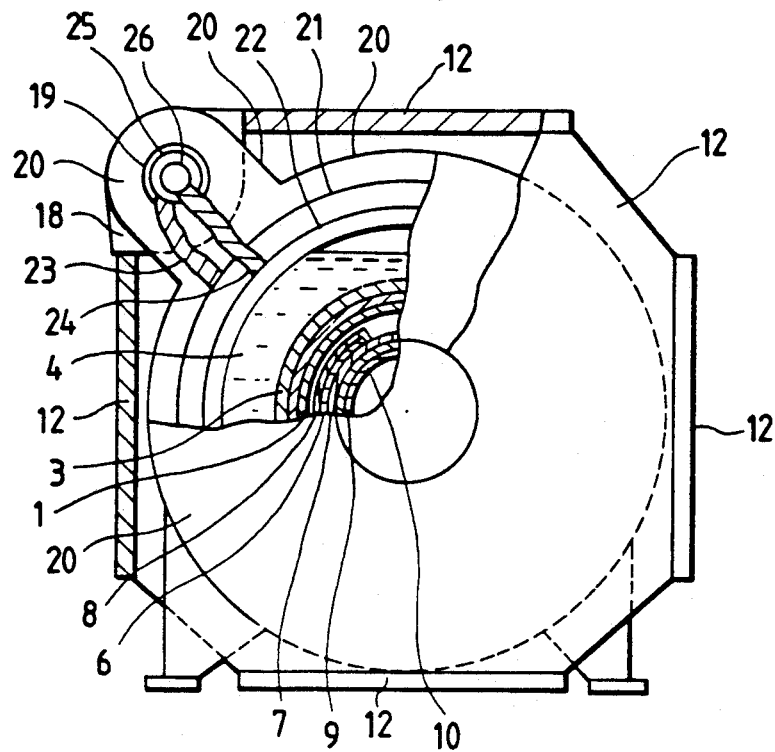
FIG. 15 is a side view of FIG. 1.

FIG. 15 is a side view of the NMR apparatus shown in the embodiments of FIGS. 1 through 14 and is a partial sectional view. In the drawing, the cryostat 1 is equipped with liquid helium 4 and its tank for storing therein the superconductor magnet 3 as the object of cooling (though they are not shown in FIGS. 1 to 14), further stores therein heat shield cylinders 21, 22 as other objects of cooling having a plurality of temperature levels (e.g. two temperature levels of about 70K and about 15K), and is separated from atmosphere by a vacuum tank 20 and its interior is subjected to heat-insulation treatment such as vacuum heat-insulation by winding a laminated heat-insulating material, for example. Though not shown in the drawing, a low temperature portion of an expander as a constituent element of a refrigerator is inserted into the cryostat and a first stage 25 cooled to about 70K and a second stage 26 cooled to about 15K are integrated to the heat shield cylinders 21, 22 through elastic heat transfer members 23, 24 such as a copper net. In this embodiment, since the expander is fitted transversely, a fixing support member capable of being disintegrated and removed is disposed on a flange 18 before the flange 18 is fastened and fixed to the magnetic shield member 12, its end portion is connected to the vacuum tank 20 and positioning of the expander is used for preventing the oscillation of the cryostat during transportation. Incidentally, reference numeral 19 represents bellows.

Figure 16:
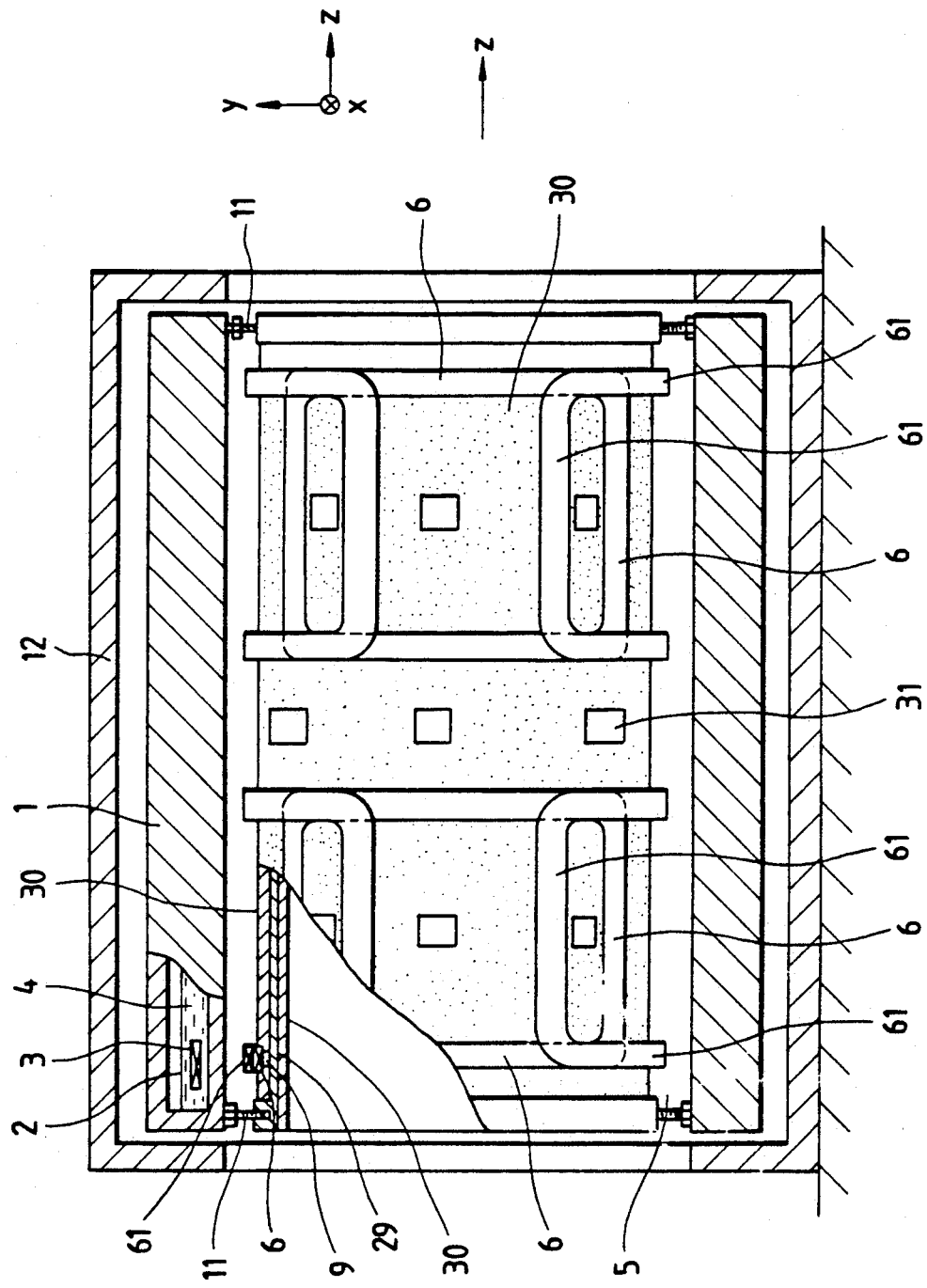
Figure 17:
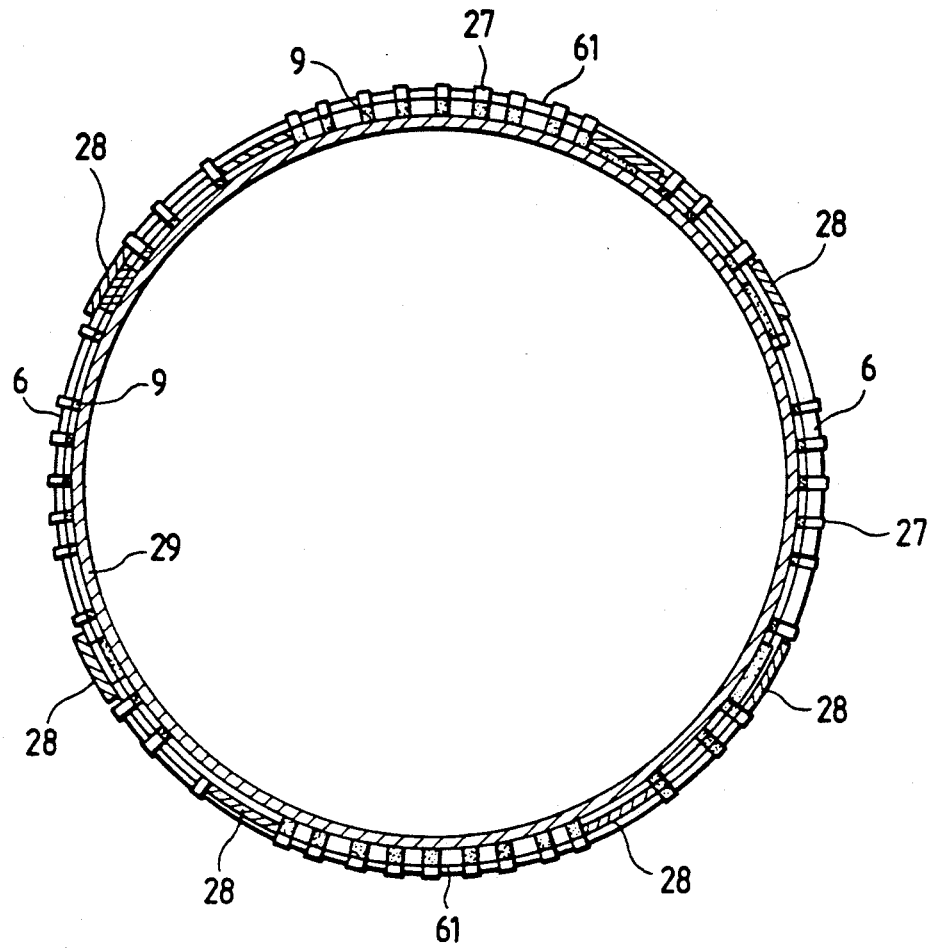
FIG. 17 is a sectional view of principal portions showing bobbins and gradient field coils that are applied to the apparatus of the embodiment shown in FIG. 16.

FIG. 16 shows the structure of the NMR apparatus in accordance with still another embodiment of the present invention and shows the interior of the apparatus by omitting the outer cylinder (shield portion) and the cryostat portion in front of the side surface of the cylinder member. FIG. 17 shows the fitting state of the bobbins and the gradient field coils.

The liquid helium tank 2 is disposed inside the cryostat 1 whose interior is vacuum heat-insulated and the superconductor magnet (magnet) 3 for generating the static field is incorporated in the helium tank 2 so as to constitute high field generation means. The superconductor magnet 3 is cooled by the liquid helium 4. The static field of 0.5 to 4 Teslas is generated in the axial direction inside the bore 5 in the center space of the cryostat 1 by this superconductor magnet 3.

The gradient field coils 6 are disposed inside the bore 5 in the y, x and z directions with respect to the direction z of the static field (the coils 6 shown in the drawing are in the x and y directions). These gradient field coils 6 are fastened and integrated by fastening metals 27, 28 and are supported by the bobbin 29 (support member) whose one end is fixed to the cryostat 1 through the elastic member 9. The load acts on the portions of the coils in the x and y directions at which the current flows in the circumferential direction, due to the pulse current that is passed through the coil. The gradient field coils only in the x and y directions are shown in the drawing to avoid complexity.

To generate a field distribution in the x and y directions inside the bore 5, two pairs of gradient field coils 6 and 61 are disposed. These gradient field coils 6 and 61 are integrated by the fastening metals 27, 28 has high rigidity and are fixed to the bobbin 29 through a plurality of elastic members 9.

Both end portions of the bobbin 29 are supported on the inner surface of the cryostat 1 by the support bolts 11 so as to make positioning of the saddle-like coils 6 and 61 (or core alignment of the cylinder member). The magnetic shield member having a weight of several tons and made of iron is disposed outside the cryostat 1 in order to reduce the leakage field space zone. Reference numeral 30 represents the sound-absorbing material.

When the pulse current for generating the gradient field is passed through the saddle-like gradient field coils 6 and 61, the electromagnetic force acting on the peripheral portion of the coil acts outward in the radial direction on the left end upper coil peripheral portion and acts towards the center of axis in the radial direction on the lower coil peripheral portion when the static field direction exists from the left towards the right in FIG. 16 in accordance with the Fleming's lefthand rule. Since the current flows backwards through the peripheral portions at the leftside centers of the coils 6 and 61, the load opposite to the above acts. The action resulting from the electromagnetic force described above is to cause deformation of the saddle-like coils 6 and 61 and if these coils 6 and 61 undergo deformation, distortion will occur in the gradient field and image processing accuracy will drop.

In this embodiment, however, since the gradient field coils 6 and 61 are firmly interconnected to one another and their rigidity is increased, their deformation due to this load is restricted and their displacement quantity can be made extremely small. The load applied to the gradient field coils 6 and 61 is transmitted to the elastic members 9 but is distributed to a large number of elastic members 9. Accordingly, the load per unit area is small and the displacement quantity of the elastic members 9 is sufficiently small so that disturbance does not occur in the gradient field distribution and consequently, a high quality image can be obtained in the three-dimensional space.

The electromotive force generated by the gradient field coils 6 and 61 is almost absorbed by the elastic member 9 but in some cases, it is not completely absorbed by the elastic member 9. In such a case, the bobbin 29 oscillates and noise is generated. The intrinsic frequency $f_0$ of the damper 31 is given by the following formula with the frequency of the bobbin 29 being f (Hz), the mass (weight) 32 of the mass-spring system (damper) 31 being m and the spring constant being k:

$$f_0 = \frac{1}{2\pi} \sqrt{\frac{k}{m}}$$

If the mass m and the spring constant k are set so as to attain $f_0 = f$, the damper 31 oscillates in the direction opposite to the oscillating direction of the bobbin 29 and inertia force acts in a direction of suppressing the oscillation of the bobbin 29 so that the oscillation of the bobbin 29 is reduced and the noise is reduced, too.

The position of disposition of the damper 31 is preferably at the position where the oscillation of the bobbin 29 is great, that is to say, at the loop of oscillation or in the proximity thereof. Generally, a plurality of loops of the oscillation of the bobbin 29 exist and hence a plurality of dampers 31 are disposed.

Figure 18:
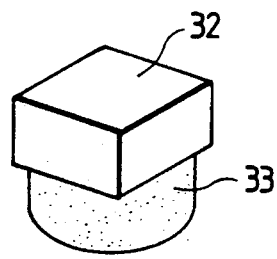
FIGS. 18 to 21 are schematic sectional views of principal portions of a mass-spring system (damper) applied to the embodiment shown in FIG. 16, respectively.
Figure 19:
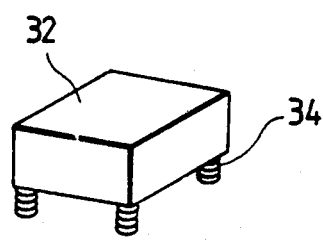
Figure 20:
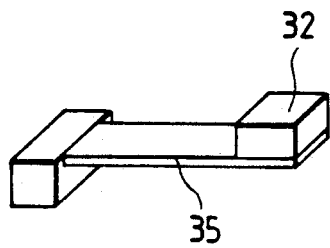
Figure 21:
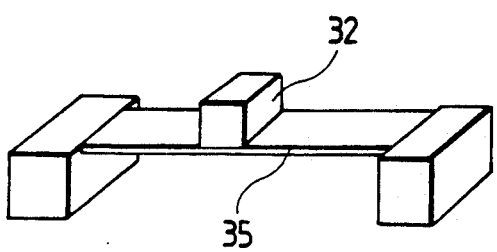

FIG. 18 shows an embodiment of the damper using a vibration-proof rubber 33, FIG. 19 shows an embodiment of the damper using a coil spring 34, FIG. 20 shows an embodiment of the damper using a cantilever leaf spring 35 and FIG. 21 shows an embodiment of the damper using a center leaf spring 35.

The damper 31 is effective for reducing an oscillation when a specific oscillation frequency is predominant and at times, a plurality of oscillation frequencies are predominant. In such a case, the oscillation and noise not set by the damper 31 occurs. Accordingly, the sound-absorbing material 30 such as urethane, glass wool, moltprene, or the like, is bonded to the inner and outer peripheral surfaces of the bobbin 29 to suppress the occurrence of the noise.

What is claimed is:

1. A nuclear magnetic resonance (NMR) apparatus including:
   ferro-magnetic field generation means for supplying a uniform and high magnetic field to a cylindrical space;
   gradient field generation means for supplying a gradient field distribution in a radial direction inside said cylindrical space; and
   cylindrical support members for fixing said gradient field generation means to a predetermined position inside said cylindrical space;
   wherein elastic members having lower rigidity than said support members are disposed between said gradient field generation means and said support members and fixed to said support members, and means for improving rigidity of said gradient field generation means as a whole is disposed and fixed to said elastic members, said means for improving rigidity having a shorter axial length than an axial length of said support members and being divided into at least two segments in an axial direction of said support members.

2. The NMR apparatus according to claim 1, wherein said means for improving rigidity is another support member interposed between said gradient field generation means and said elastic member.

3. The NMR apparatus according to claim 1, wherein said means for improving rigidity is a fastening jig for fixing said gradient field generation means to said elastic member.

4. An NMR apparatus including:
   ferro-magnetic field generation means for supplying a uniform and high magnetic field to a cylindrical space;
   gradient field generation means for supplying a gradient field distribution in a radial direction inside said cylindrical space; and
   a first cylindrical support member for fixing said gradient field generation means to a predetermined position inside said cylindrical space;
   wherein an elastic member having lower rigidity and a shorter axial length than that of said first support member and being divided into at least two segments in an axial direction of said support member is disposed between said gradient field generation means and said first support member, and a second support member having higher rigidity than said elastic member and having a shorter axial length than an axial length of said first support member and being divided into at least two segments in an axial direction of said first support member is fitted to said gradient field generation means.

5. An NMR apparatus including:
   ferro-magnetic field generation means for supplying a uniform and high magnetic field to a cylindrical space; and
   a cylindrical first support member for supporting thereoutside said gradient field generation means, fixed to a cryostat equipped with said ferro-magnetic field generation means;
   wherein a second support member having a high rigidity for mounting said gradient field generation means and having a shorter axial length than an axial length of said first support member and being divided into at least two segments in an axial direction of said first support member and an elastic member for supporting said second support member outside said first support member are disposed between said first support member and said gradient field generation means, and said elastic member has lower rigidity than that of said first and second support members and a shorter axial length than an axial length of said first support member, said elastic member being divided into more than two segments in an axial direction of said first support member.

6. An NMR apparatus including:

ferro-magnetic field generation means for supplying a uniform and high magnetic field to a cylindrical space;

gradient field generation means for supplying a gradient field distribution in a radial direction inside said cylindrical space;

a cylindrical first support member for supporting said gradient field generation means;

a cryostat equipped with said ferro-magnetic field generation means; and a magnetic shielding member disposed outside said cryostat;

wherein a second support member having high rigidity, for mounting said gradient field generation means, and an elastic member for supporting said second support member outside said first support member are disposed between said first support member and said gradient field generation means, said second support member having a shorter axial length than an axial length of said first support member and being divided into at least more than two segments in an axial direction of said first support member, said elastic member having a lower rigidity than that of said first and second support members and a shorter axial length than an axial length of said first support member and being divided into at least more than two segments in an axial direction of said first support member, and said first support member being fixed to said magnetic shielding member.

7. The NMR apparatus according to any of claims 4 through 6, wherein at least part of said gradient field generation means is buried into said second support member.

8. The NMR apparatus according to any of claims 4 through 6, wherein said first and second support members have a toroidal or cylindrical shape and a plurality of vent holes are formed in said toroidal or cylindrical side surface.

9. The NMR apparatus according to any of claims 4 through 6, wherein a sound-absorbing material is provided to at least one of said ferro-magnetic field generation means or said cryostat for storing said ferro-magnetic field generation means and said first support member.

10. The NMR apparatus according to claim 8, wherein said vent holes of said first support member are disposed in such a manner as to correspond to said vent holes of said second support member.

11. An NMR apparatus including:

ferro-magnetic field generation means for supplying a uniform and high magnetic field to a cylindrical space;

gradient field generation means for supplying a gradient field distribution in a radial direction inside said cylindrical space; and a support member for fixing said gradient field generation means at a predetermined position inside said cylindrical space;

wherein an elastic member having lower rigidity than said support member is disposed between said gradient field generation means and said support member, a damper consisting of a mass and a spring is provided to the outer peripheral surface of said support member and a sound-absorbing material is bonded to the inner and outer peripheral surfaces of said support member.

12. The NMR apparatus according to claim 11, wherein said spring consists of an elastic member such as a vibration-proofing rubber, a polymeric resin, a metal, or the like.

13. The NMR apparatus according to claim 11, wherein said gradient field generation means consists of coils of x, y and z direction components which are fastened or molded integrally with one another.

14. A NMR apparatus according to claim 1, wherein an outer cylinder formed with vent holes is covered on an inner cylinder formed with vent holes through an elastic member and said inner cylinder is formed with a fixing location for a main body of the NMR apparatus.

15. An NMR apparatus according to claim 1, wherein such gradient field generator means includes a gradient field generation coil disposed outside a cylindrical support member of a high rigidity, at least a part of said coil is protected by a fiber-reinforced resin, an annular support member corresponding to another inner cylinder is passed in an outer cylinder of said cylindrical support member and both annular support members are communicated by an elastic member having a lower rigidity than that of each of the support members.

16. An inspected item storing container according to claim 15, wherein said gradient field generation coil is made such that at least a part thereof is disposed outside said annular support member of high rigidity through an elastic member and a fiber reinforced resin in sequence.

17. An NMR apparatus according to any of claims 4 through 6, wherein said elastic member is divided into at least more than two segments in a circumferential direction of said first support member or has a cavity within said elastic member.

18. An NMR apparatus according to any of claims 4 through 6, wherein an outer cylinder formed with vent holes is covered on an inner cylinder formed with vent holes through an elastic member and said inner cylinder is formed with a fixing location for a main body of the NMR apparatus.

19. An NMR apparatus according to any of claims 4 through 6, wherein said gradient field generation means includes a gradient field generation coil disposed outside a cylindrical support member of high rigidity, at least a part of said coil is protected by a fiber-reinforced resin, an annular support member corresponding to another inner cylinder is passed in an outer cylinder with said cylindrical support member being the outer cylinder, and both annular support members are communicated by an elastic member of a smaller rigidity than that of each of the support members.

20. An inspected item storing container according to claim 19, wherein said gradient field generation coil is made such that at least a part of it is disposed outside said annular support member of a high rigidity through an elastic member and a fiber-reinforced resin in sequence.

* * * * *